(12) United States Patent
Shawwa et al.

(10) Patent No.: US 8,817,914 B2
(45) Date of Patent: Aug. 26, 2014

(54) INTERACTIVE DIGITAL DUTY CYCLE COMPENSATION CIRCUIT FOR RECEIVER

(75) Inventors: Amna Z. Shawwa, Taoyuan County (TW); Chia-Jen Chang, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 503 days.

(21) Appl. No.: 13/219,563

(22) Filed: Aug. 26, 2011

(65) Prior Publication Data

US 2013/0051495 A1 Feb. 28, 2013

(51) Int. Cl.
*H04L 27/00* (2006.01)
*G11C 7/10* (2006.01)
*H03K 5/156* (2006.01)

(52) U.S. Cl.
CPC ............ *G11C 7/1084* (2013.01); *H03K 5/1565* (2013.01)
USPC ............ 375/316; 375/318; 375/354; 327/171; 327/172; 327/175

(58) Field of Classification Search
CPC ....... H03K 5/003; H03K 5/1565; G11C 7/22; G11C 7/222; G11C 7/1078; G11C 7/1084; G11C 7/1093
USPC ............ 375/316, 318, 354; 327/171, 172, 175
See application file for complete search history.

(56) References Cited

U.S. PATENT DOCUMENTS

| | | | | |
|---|---|---|---|---|
| 7,199,632 B2 * | 4/2007 | Chun et al. | ..................... | 327/172 |
| 7,203,860 B2 * | 4/2007 | Ishida et al. | ................... | 713/503 |
| 7,268,603 B2 * | 9/2007 | Baker et al. | .................... | 327/175 |
| 7,307,461 B2 * | 12/2007 | Nguyen et al. | ................. | 327/172 |
| 8,358,162 B2 * | 1/2013 | Kang | ............................ | 327/175 |

* cited by examiner

*Primary Examiner* — Leon Flores

(57) ABSTRACT

A receiver circuit. A receiving stage is coupled to a first supply voltage and an input signal, and operative to generate a first intermediate signal from the input signal based on the first supply voltage. A compensation stage is coupled to a second supply voltage and the first intermediate signal, and operative to generate a second intermediate signal by adjusting duty cycle of the first intermediate signal upon detecting changes in the first supply voltage to compensate for the changes in the first supply voltage. An outputting stage is coupled to the second supply voltage and operative to generate an output signal based on the second supply voltage upon receiving the second intermediate signal. A voltage of the output signal is adjusted to a level of the second supply voltage and the output signal has a 50% duty cycle.

16 Claims, 8 Drawing Sheets

US 8,817,914 B2

INTERACTIVE DIGITAL DUTY CYCLE COMPENSATION CIRCUIT FOR RECEIVER

BACKGROUND OF THE INVENTION

1. Field of the Invention

The invention relates to a receiver circuit, and more particularly to a receiver circuit of a memory device that dynamically adjusts duty cycle of various input signal voltages or external voltages to the memory device for generating output signals having a 50% duty cycle.

2. Description of the Related Art

Double data rate synchronous dynamic random access memory (DDR SDRAM) is a class of memory integrated circuits used in computers. Compared to single data rate (SDR) SDRAMs, the DDR SDRAM interface provides higher data transfer rates through stricter control of the timing of electrical data and clock signals. Implementations of such timing control frequently utilize technologies such as phase locked loop (PLL) and self-calibration to reach the required timing accuracy. The interface uses double pumping technique, i.e., transferring data on both the rising and falling edges of a clock signal, to lower clock frequency. One advantage of keeping the clock frequency low is that it reduces signal integrity requirements on the circuit board connecting the memory to the controller. The name "double data rate" refers to the fact that a DDR SDRAM with a certain clock frequency achieves nearly twice the bandwidth of a single data rate (SDR) SDRAM running at the same clock frequency, due to the double pumping technique.

For a DDR SDRAM, it is important that the memory device provides a 50% stable duty cycle, e.g., as measured by the positive or negative pulse width, for certain critical signals, such as clock and strobe signals, especially when it is operating in a high frequencies environment. However, due to the design nature of a receiver, especially in a current mode logic (CML) receiver, the duty cycle is dependent upon the power and reference voltages provided to the memory device. Any change in the external voltage, internal voltage or reference voltage, will cause the duty cycle to change.

Therefore, a novel receiver circuit that is capable of dynamically adjusting a duty cycle of an input signal to compensate for changes in external voltages, internal voltages or reference voltages and providing an output signal having a 50% duty cycle is highly required.

BRIEF SUMMARY OF THE INVENTION

Receiver circuit and compensation circuit are provided. An exemplary embodiment of a receiver circuit comprises a receiving stage, a compensation stage and an outputting stage. The receiving stage is coupled to a first supply voltage and an input signal, and operative to generate a first intermediate signal from the input signal based on the first supply voltage. The compensation stage is coupled to a second supply voltage and the first intermediate signal, and operative to generate a second intermediate signal by adjusting duty cycle of the first intermediate signal upon detecting changes in the first supply voltage to compensate for the changes in the first supply voltage. The outputting stage is coupled to the second supply voltage and is operative to generate an output signal based on the second supply voltage upon receiving the second intermediate signal. A voltage of the output signal is adjusted to a level of the second supply voltage and the output signal has a 50% duty cycle.

An exemplary embodiment of a compensation circuit comprises a detection circuit and a duty cycle adjusting circuit. The detection circuit is operative to generate a plurality of control signal pairs upon detecting changes in a first supply voltage, where contents of the plurality of control signal pairs reflect an amount of change in the first supply voltage. The duty cycle adjusting circuit is operative to generate a second signal by adjusting a duty cycle of a first signal according to the plurality of control signal pairs upon receiving the first signal and the plurality of control signal pairs to compensate for the changes in the first supply voltage. The second signal has a 50% duty cycle.

An exemplary embodiment of a method of generating a level shifted output signal having a 50% duty cycle comprises: receiving an input signal and driving the input signal based on a first supply voltage to generate a first intermediate signal; detecting changes in the first supply voltage to generate a plurality of control signal pairs, wherein contents of the plurality of control signal pairs reflect an amount of change in the first supply voltage; adjusting a duty cycle of the first intermediate signal to compensate for the changes in the first supply voltage and generate a second intermediate signal, accordingly, wherein the second intermediate signal has a 50% duty cycle; and receiving the second intermediate signal and driving the second intermediate signal based on a second supply voltage to generate an output signal. A voltage of the output signal is adjusted to a level of the second supply voltage and the output signal has a 50% duty cycle.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

Figure 6A:
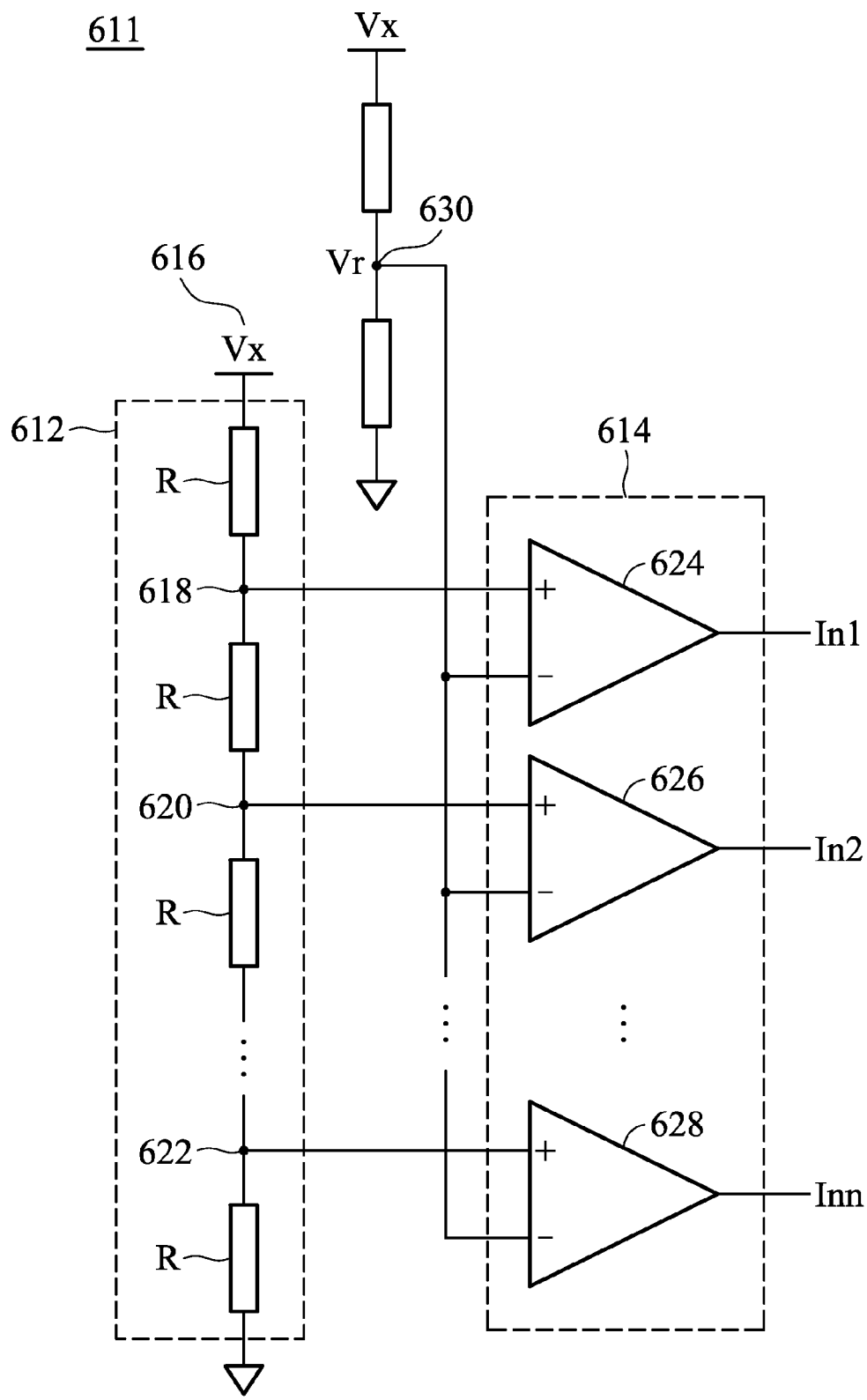
FIG. 6a is a schematic showing an exemplary analog-to-digital converter (ADC) configured in the increment detection circuit according to an embodiment of the invention.
Figure 6B:
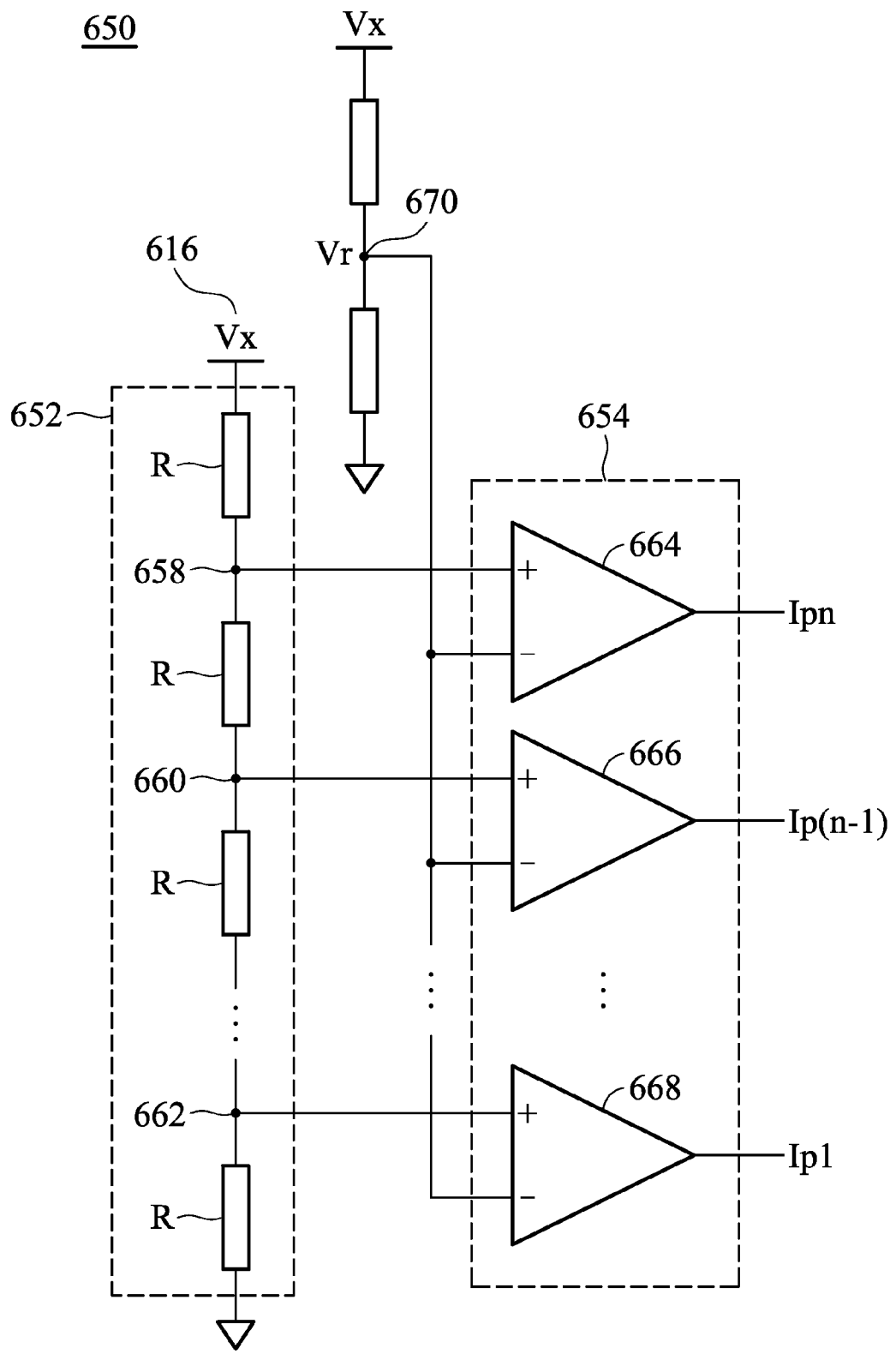
FIG. 6b is a schematic showing an exemplary ADC configured in the decrement detection circuit according to an embodiment of the invention.

Table 1 shows the digital signals obtained by the ADC circuit shown in FIG. 6a; and Table 2 shows the digital signals obtained by the ADC circuit shown in FIG. 6b.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
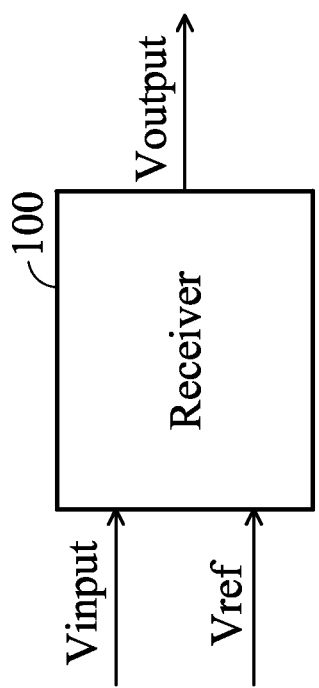
FIG. 1 is a diagram illustrating a simplified receiver of a memory device according to an embodiment of the invention.
Figure 2:
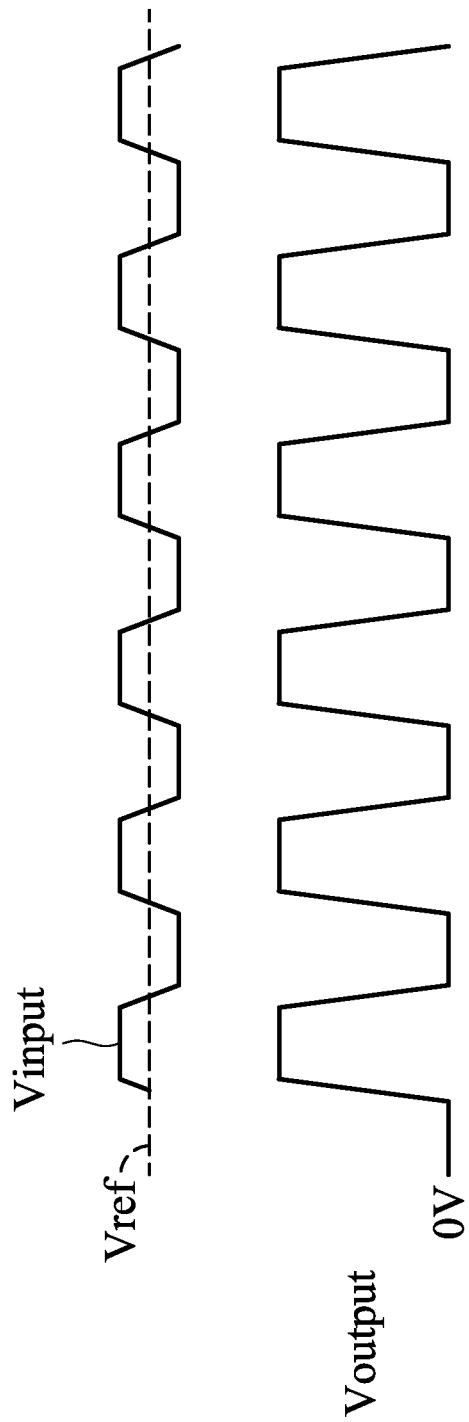
FIG. 2 is a simplified diagram showing the signal waveforms of the input and output signals of the receiver.

FIG. 1 is a diagram illustrating a simplified receiver of a memory device according to an embodiment of the invention. The receiver 100 receives an input signals Vinput and Vref and generates an output signal Voutput. According to the embodiments of the invention, external signals, command, data, address and clock of the memory device may be applied to the input of the receiver as the input signal Vinput, where the memory device may be, as an example, a double data rate synchronous dynamic random access memory (DDR SDRAM). The receiver 100 converts the input signal Vinput into internal voltage-level signals. FIG. 2 is a simplified diagram showing the signal waveforms of the input and output signals of the receiver 100. In an exemplary embodiment of the invention, the voltage levels of the input signal Vinput may span from the low of (Vref−swing) to the high of (Vref+swing), where Vref=(Vx/2), Vx is the external voltage provided from a memory controller coupled to the memory device and applied on the memory chip. Definition of swing is defined in the Joint Electron Devices Engineering Council (JEDEC) specification. Receiver 100 converts the voltage level of the output signal Voutput to be equal to the voltage of internal level (Vint) generated on the memory chip. As previously discussed, a converted signal with a 50% duty cycle is desirable. However, the duty cycle is subject to change due to changes in power supply and reference voltages. Therefore, the receiver 100 with a compensation circuit that is capable of dynamically adjusting duty cycle in accordance with changes of input and outputting signals having a 50% duty cycle is proposed and will be discussed in more detail in the following paragraphs.

Figure 3:
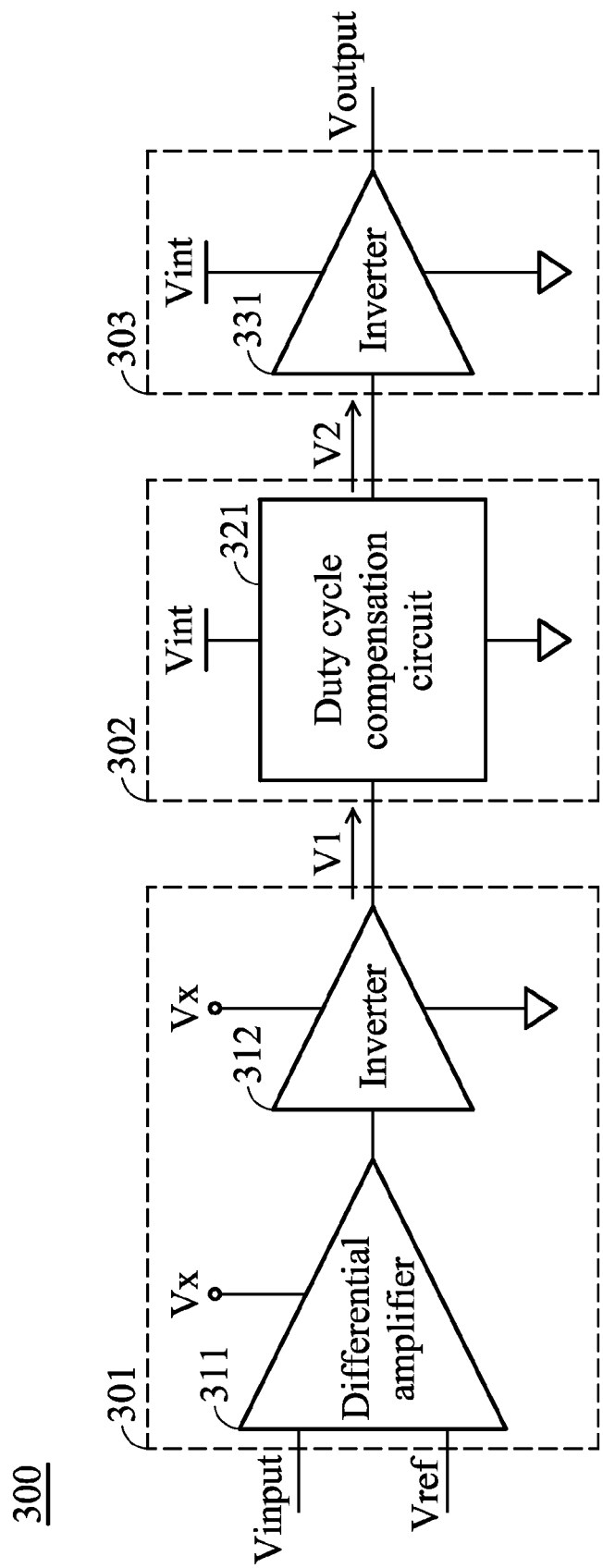
FIG. 3 is a schematic illustrating an exemplary receiver circuit according to an embodiment of the invention.

FIG. 3 is a schematic illustrating an exemplary receiver circuit according to an embodiment of the invention. The receiver 300 comprises a receiving stage 301, a compensation stage 302 and an outputting stage 303. The receiving stage 301 is coupled to external supply voltage Vx, receives signals Vinput and Vref, and based on the external supply voltage Vx drives the input signal Vinput to operative to generate a first intermediate signal V1. The compensation stage 302 receives the first intermediate signal V1, detects changes in the external supply voltage Vx, and adjusts a duty cycle of the first intermediate signal V1 to compensate for the changes in the external supply voltage Vx and operative to generate a second intermediate signal V2, accordingly. The outputting stage 303 is coupled to an internal supply voltage Vint, receives the second intermediate signal V2, and based on the internal supply voltage Vint drives the second intermediate signal V2 to operative to generate an output signal Voutput, accordingly. According to the embodiments of the invention, a voltage level of the output signal Voutput is shifted by the receiver 300 to be equal to the chip internal level (Vint), and the output signal Voutput has a 50% duty cycle. For example, as is illustrated in FIG. 3, because the output stage of the receiver 300 is an inverter that powered on Vint, the output level of receiver 300 will be Vint.

Note that in other embodiments of the invention, the compensation stage 302 may also detect changes in any other supply voltages and/or reference voltages that might influence the duty cycle of the signal provided by the receiver, such as the reference voltage Vref. The external supply voltage Vx illustrated hereinafter is merely an example to aid for understanding the concept of the invention, and the invention should not be limited thereto.

The receiving stage 301 comprises a differential amplifier 311 and an inverter 312. The differential amplifier 311 receives the input signals Vinput and Vref and operative to generate an amplified input signal. The inverter 312 drives the amplified input signal and operative to generate the first intermediate signal V1. Because the inverter 312 is powered on Vx, the output level of the first intermediate signal V1 will be Vx. The compensation stage 302 comprises a duty cycle compensation circuit 321 compensating for the changes in, for example, the external supply voltage Vx and is operative to generate the second intermediate signal V2. The outputting stage 303 comprises an inverter 331 for further driving the second intermediate signal V2 and generating the output signal Voutput.

Figure 4:
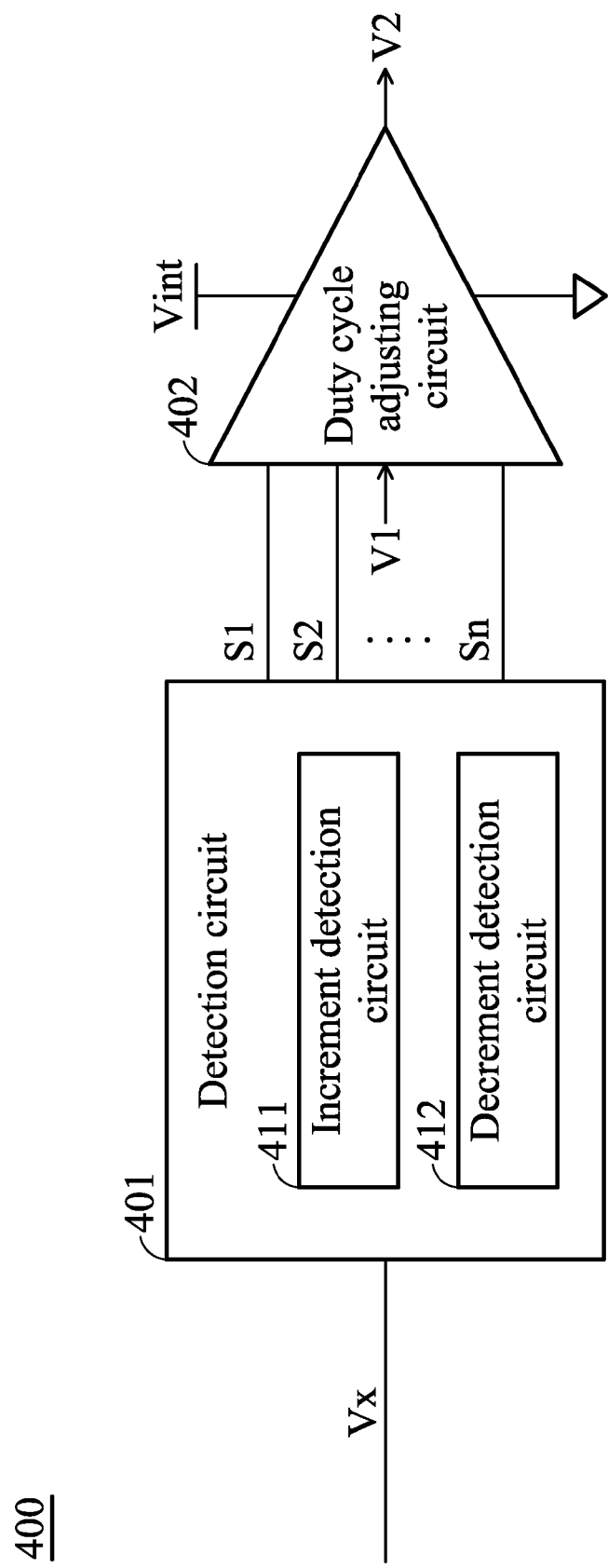
FIG. 4 is a block diagram showing an exemplary duty cycle compensation circuit according to an embodiment of the invention.

FIG. 4 is a block diagram showing an exemplary duty cycle compensation circuit according to an embodiment of the invention. The duty cycle compensation circuit of the compensation stage 302 comprises a detection circuit 401 and a duty cycle adjusting circuit 402. The detection circuit 401 detects changes in, for example, the external supply voltage Vx, and is operative to generate a plurality of control signals S1, S2 . . . Sn, accordingly. According to the exemplary embodiment of the invention, contents of the plurality of control signals S1, S2 . . . Sn reflect the amount of change in the external supply voltage Vx. Note that as previously discussed, any other supply voltages and/or reference voltages that might influence the duty cycle of the signal provided by the receiver, such as the reference voltage Vref, may also be applied to the detection circuit 401 and the invention should not be limited thereto. The duty cycle adjusting circuit 402 receives the first intermediate signal V1 and the plurality of control signals S1, S2 . . . Sn, and is operative to generate the second intermediate signal V2 according to the first intermediate signal V1 and the plurality of control signals S1, S2 . . . Sn (which will be illustrated in more detail in the following paragraphs).

According to an exemplary embodiment of the invention, detection circuit 401 comprises an increment detection circuit 411 for detecting incremental changes in, for example, the external supply voltage Vx, and generating a plurality of first control signals (Sn1, Sn2, . . . Snn, shown in FIG. 7) as a portion of the plurality of control signals S1, S2 . . . Sn. Alternatively, detection circuit 401 comprises a decrement detection circuit 412 for detecting decrement changes in, for example, the external supply voltage Vx, and generating a plurality of second control signals (Sp1, Sp2, . . . Spn, shown in FIG. 7) as another portion of the plurality of control signals S1, S2 . . . Sn. Note that the detection circuit 401 may also be implemented in various ways, such as with both increment and decrement detection circuits, to achieve the purpose of detecting the changes in voltage. FIG. 4 only shows one exemplary circuit and the invention should not be limited thereto.

Figure 5:
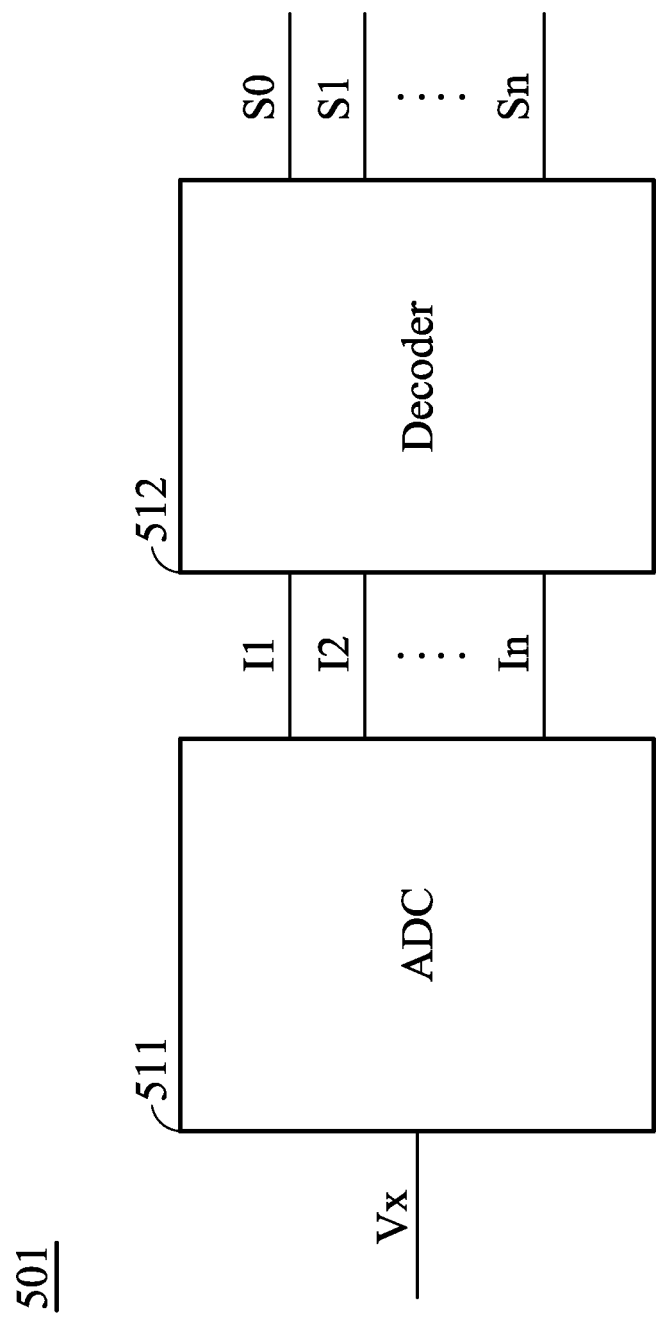
FIG. 5 is a block diagram illustrating an exemplary increment/decrement detection circuit according to an embodiment of the invention.

FIG. 5 is a block diagram illustrating an exemplary increment/decrement detection circuit according to an embodiment of the invention. In the embodiment, increment/decrement detection circuit 501 comprises an analog-to-digital converter (ADC) 511 for detecting the voltage level of input external supply voltage Vx and converting it to digital signals. The voltage level of input external supply voltage Vx may be mapped to one of n digital signals I1, I2 . . . In by the ADC 511, where n is dependent on the required accuracy of compensating the duty cycle in the duty cycle adjusting circuit 402. The increment/decrement detection circuit 501 may further comprise a decoder 512 receiving and driving the plurality of digital signals I1, I2 . . . In and operative to generate the plurality of control signals S1, S2 . . . Sn. Note that in the embodiment of the invention, the decoder 512 may be designed as a driver for driving the input digital signals. For example, the decoder 512 may comprise a plurality of inverters for driving the input digital signals. However, it should be understood that based on different ADC designs, there are various ways to implement a decoder circuit and the invention should not be limited thereto.

Note also that digital signals I1, I2 . . . In may be used here to represent either a plurality of digital signals In1, In2 . . . Inn or a plurality of digital signals Ip1, Ip2 . . . Ipn. The plurality of digital signals In1, In2 . . . Inn may be generated by the ADC 511 inside of the increment detection circuit 411. The plurality of digital signals Ip1, Ip2 . . . Ipn may be generated by the ADC 511 inside of the decrement detection circuit 412. Control signals S1, S2 . . . Sn may also be used here to represent either a plurality of control signals Sn1, Sn2 . . . Snn or the plurality of control signals Sp1, Sp2 . . . Spn. The plurality of control signals Sn1, Sn2 . . . Snn may be generated by the decoder 512 inside of the increment detection circuit 411. The plurality of control signals Sp1, Sp2 . . . Spn may be generated by the decoder 512 inside of the decrement detection circuit 412. The plurality of control signals Sn1, Sn2 . . . Snn and Sp1, Sp2 . . . Spn may be formed as a plurality of control signal pairs to control operations of the duty cycle adjusting circuit 402. The operations of the duty cycle adjusting circuit 402 will be discussed in more detail in the following paragraphs.

FIG. 6a is a schematic diagram of an ADC configured inside of the increment detection circuit according to an embodiment of the invention. ADC 611 comprises a voltage divider 612 and a plurality of comparators 614. Voltage divider 612 divides, for example, an external supply voltage Vx 616 into a plurality of comparing voltages 618, 620, 622. The plurality of comparators 614 includes a number of individual comparator 624, 626, 628. Each individual comparator receives and compares a reference voltage Vr 630 to one of the plurality of comparing voltages 618, 620, 622, and is operative to generate one of the plurality of digital signals In1, In2, . . . Inn. FIG. 6b is a schematic diagram of an ADC configured inside of the decrement detection circuit according to another embodiment of the invention. ADC 650 comprises a voltage divider 652 and a plurality of comparators 654. Voltage divider 652 divides, for example, the external supply voltage Vx 616 into a plurality of comparing voltages 658, 660, 662. The plurality of comparators 654 includes a number of individual comparators 664, 666, 668. Each individual comparator receives and compares a reference voltage Vr 670 to one of the plurality of comparing voltages 658, 660, 662, and operative to generate one of the plurality of digital signals Ip1, Ip2, . . . Ipn. It should be understood that there are other ways to implement an ADC and the invention should not be limited to the mechanism disclosed herein.

Based on the ADC circuits shown in FIGS. 6a and 6b, taking the accuracy swing of n=3 as an example, the digital signals obtained by the ADC circuits is shown in the following tables:

TABLE 1 the digital signals obtained by the ADC circuit shown in FIG. 6a

| Vx | In1 | In2 | In3 |
|---|---|---|---|
| Nominal | 0 | 0 | 0 |
| +Δ | 1 | 0 | 0 |
| +2Δ | 1 | 1 | 0 |
| +3Δ | 1 | 1 | 1 |

TABLE 2 the digital signals obtain by the ADC circuit shown in FIG. 6b

| Vx | Ip1 | Ip2 | Ip3 |
|---|---|---|---|
| Nominal | 1 | 1 | 1 |
| −Δ | 0 | 1 | 1 |
| −2Δ | 0 | 0 | 1 |
| −3Δ | 0 | 0 | 0 |

As shown in the exemplary digital values obtained by the ADC circuits as shown in Table 1 and Table 2, once Vx changes by an increment or decrement by Δ, the changes is reflected on the values of the digital signals In1, In2, . . . Inn and Ip1, Ip2, . . . Ipn (represented by I1, I2, . . . In in FIG. 5). The 1's and 0's in the table above mean the values of the corresponding digital signals In1, In2, . . . Inn and Ip1, Ip2, . . . Ipn, and Δ represents the amount of change. The decoder as shown in FIG. 5 further drives the digital signals In1, In2, . . . Inn and Ip1, Ip2, . . . Ipn to generate the plurality of control signals Sn1, Sn2 . . . Snn and Sp1, Sp2 . . . Spn (represented by S1, S2, . . . Sn in FIG. 5) so as to further control operations of the duty cycle adjusting circuit 402 based on the values of the corresponding digital signals In1, In2, . . . Inn and Ip1, Ip2, . . . Ipn. (which will be illustrated in more detail in the following paragraphs).

Figure 7:
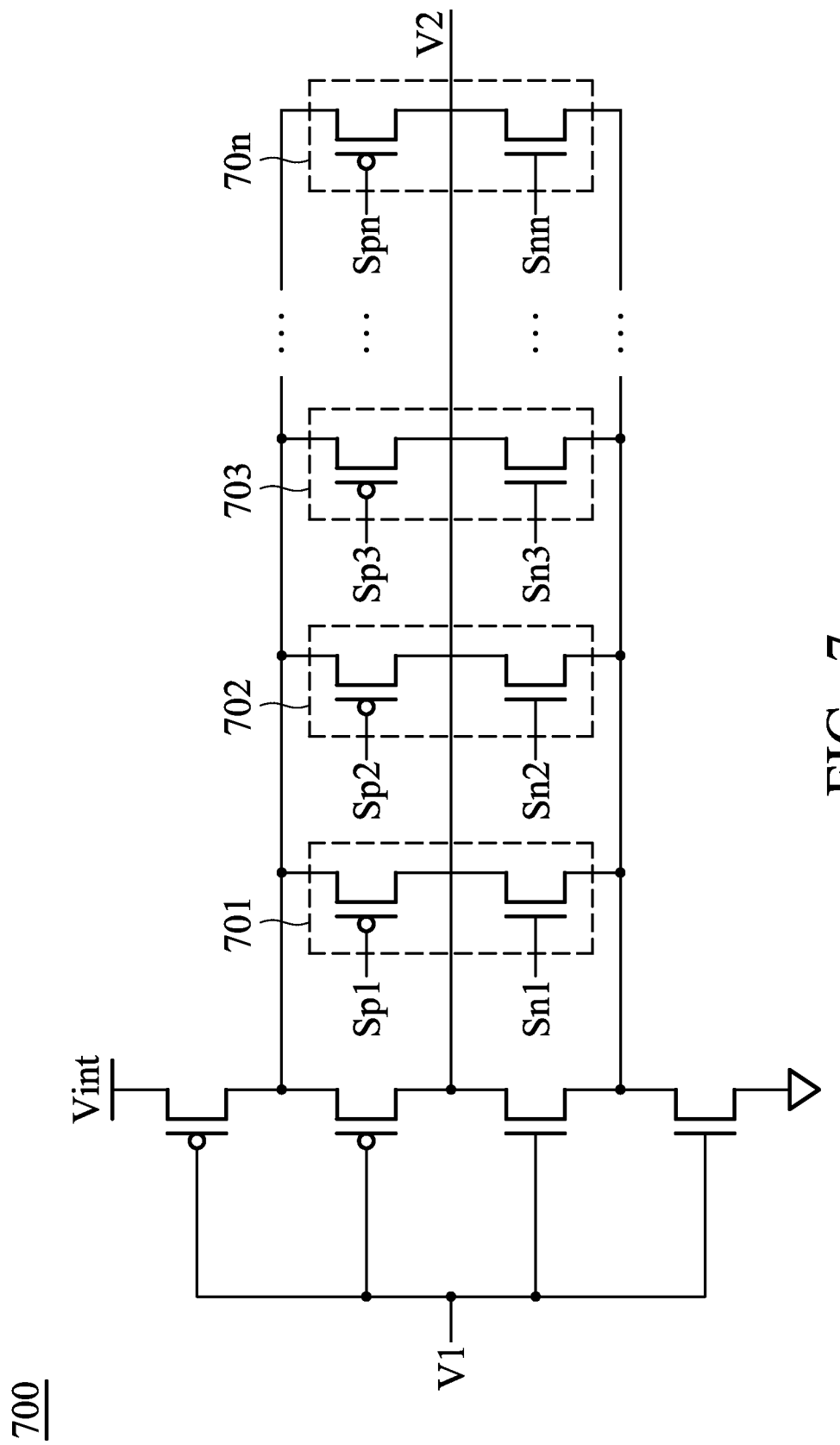
FIG. 7 is a simplified schematic diagram illustrating the duty cycle adjusting circuitry according to an exemplary embodiment of the invention.

FIG. 7 shows a simplified diagram of the duty cycle adjusting circuit according to an embodiment of the invention. Duty cycle adjusting circuit 700 comprises a plurality of metal-oxide-semiconductor (MOS) transistor pairs 701, 702, 703, . . . 70n, coupled in parallel. Each of the plurality of MOS transistor pairs comprises a first type of MOS transistor (for example, NMOS transistor) and a second type of MOS transistor (for example, PMOS transistor) coupled in serial, and is arranged to receive one of the plurality of the control signal pairs (Sp1, Sn1), (Sp2, Sn2), (Sp3, Sn3) . . . (Spn, Snn) so as to be turned on or off according to the corresponding control signal pair. As previously discussed, in the exemplary embodiment of the invention, the value n may be flexibly designed according to the required compensation accuracy. According to the exemplary embodiments of the invention, when the external supply voltage Vx increases, the duty cycle will increase as well. Detection circuit 401 is designed to reflect this change on the control signals S1, S2 . . . Sn, i.e., the control signal pairs (Sp1, Sn1), (Sp2, Sn2), (Sp3, Sn3) . . . (Spn, Snn). According to levels of control signals (Sp1, Sn1), (Sp2, Sn2), (Sp3, Sn3) . . . (Spn, Snn), the corresponding MOS transistors will be turned on or off to adjust the duty cycle. For example, refer to Table 1 and Table 2, when Vx is nominal, all cpmpansation MOS transistor pairs (701, 702 . . . 70n) are off. When Vx is increased by Δ, then the Sn1 will go high and will turn on the NMOS transistor in the MOS transistor pair 701 while the PMOS transistor in the MOS transistor pair 701 will remain off. When Vx is increased by 2Δ, both the Sn1, Sn2 will go high and that will turn on both NMOS transistors in the MOS transistor pairs 701 and 702. When Vx is increased by 3Δ, then the Sn1, Sn2, Sn3 will go high and turn on NMOS transistors in the MOS transistor pairs 701, 702 and 703. So for nΔ of increment in Vx, the Sn1, Sn2 . . . Snn will go high and turn on NMOS transistors in the MOS transistor pairs 701, 702 . . . 70n.

On the other hand if Vx decreases, one or more of PMOS transistors of the duty cycle adjusting circuit 700 will be turned on. For instance, if Vx is decreased by Δ, Sp1 will become low and that will turn on PMOS transistor in the MOS transistor pair 701, and so forth. The MOS transistors will be sized in the design to compensate the effect of Vx changes on the duty cycle.

Since the relationship between Vx changes and the duty cycle is almost linear, a proper amount of MOS transistors may be selected to be turned on via the control signals to decrease the duty cycle when, for example, the external supply voltage Vx is determined to have increased. Alternatively, a proper number of MOS transistors may be selected to be turned on via the control signals to increase the duty cycle when, for example, the external supply voltage Vx is determined to have decreased. According to the embodiments of the invention, adding NMOS transistors leads to duty cycle decrement, while adding PMOS transistors leads to duty cycle increment. The more MOS devices is used, the higher the accuracy of duty cycle may be obtained. In this manner, based on the proposed receiver with digital compensating circuit, automatic detection of the changes in the applied external voltage (or any other supply voltages and/or reference voltages that would influence the duty cycle of the signal provided by the receiver) is achieved so as to interactively adjust the duty cycle to 50%.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A receiver circuit, comprising:
a receiving stage coupled to a first supply voltage and an input signal, operative to generate a first intermediate signal from the input signal based on the first supply voltage;
a compensation stage coupled to a second supply voltage and the first intermediate signal, operative to generate a second intermediate signal by adjusting duty cycle of the first intermediate signal upon detecting changes in the first supply voltage to compensate for the changes in the first supply voltage; and
an outputting stage coupled to the second supply voltage and operative to generate an output signal based on the second supply voltage upon receiving the second intermediate signal,
wherein a voltage of the output signal is adjusted to a level of the second supply voltage and the output signal has a 50% duty cycle,
wherein the compensation stage comprises:
a detection circuit, operative to generate a plurality of control signals upon detecting the change in the first supply voltage, wherein contents of the plurality of control signals reflect an amount of change in the first supply voltage; and
a duty cycle adjusting circuit, operative to generate the second intermediate signal according to the first intermediate signal and the plurality of control signals upon receiving the first intermediate signal and the plurality of control signals and, wherein the second intermediate signal has a 50% duty cycle,
wherein the detection circuit comprises:
an increment detection circuit, operative to generate a plurality of first control signals as a portion of the plurality of control signals upon detecting increment in the first supply voltage; and
a decrement detection circuit, operative to generate a plurality of second control signals as a portion of the plurality of control signals upon detecting decrement in the first supply voltage,
wherein the increment/decrement detection circuit comprises:
an analog to digital converter (ADC), coupled to the first supply voltage and operative to generate a plurality of digital signals by mapping a voltage level of the first supply voltage to the plurality of digital signals,
wherein the ADC comprises:
a voltage divider, operative to generate a plurality of comparing voltages by dividing the first supply voltage into the plurality of comparing voltages; and
a plurality of comparators, each receiving a reference voltage and one of the plurality of comparing voltages and operative to generate one of the plurality of digital signals by comparing the reference voltage with the one of the plurality of comparing voltages.

2. The receiver circuit as claimed in claim 1, wherein the duty cycle adjusting circuit is operative to generate the second intermediate signal by decreasing the duty cycle of the first intermediate signal when the first supply voltage is determined to have increased.

3. The receiver circuit as claimed in claim 1, wherein the increment/decrement detection circuit further comprises:
a decoder, operative to generate the plurality of first/second control signals by driving the plurality of digital signals upon receiving the plurality of digital signals.

4. The receiver circuit as claimed in claim 1, wherein the duty cycle adjusting circuit comprises:
a plurality of metal-oxide-semiconductor (MOS) transistor pairs, coupled in parallel, wherein each of the plurality of MOS transistor pairs comprises a first type of MOS transistor and a second type of MOS transistor coupled in serial, and is arranged to be turned on or off according to the plurality of control signals.

5. The receiver circuit as claimed in claim 1, wherein the input signal is one of data, signals, commands, addresses and clocks of a memory device.

6. The receiver circuit as claimed in claim 5, wherein the memory device is a double data rate synchronous dynamic random access memory (DDR SDRAM).

7. A compensation circuit, comprising:
a detection circuit, operative to generate a plurality of control signal pairs upon detecting changes in a first supply voltage, wherein contents of the plurality of control signal pairs reflect an amount of change in the first supply voltage; and
a duty cycle adjusting circuit, operative to generate a second signal by adjusting a duty cycle of a first signal according to the plurality of control signal pairs upon receiving the first signal and the plurality of control signal pairs to compensate for the changes in the first supply voltage,
wherein the second signal has a 50% duty cycle,
wherein the detection circuit comprises:
an increment detection circuit, operative to generate a plurality of first control signals upon detecting increment in the first supply voltage; and
a decrement detection circuit, operative to generate a plurality of second control signals upon detecting decrement in the first supply voltage,
wherein one of the plurality of first control signals and one of the plurality of second control signals form one of the control signal pairs, wherein the increment/decrement detection circuit comprises:
an analog to digital converter (ADC), coupled to the first supply voltage and operative to generate a plurality of digital signals by mapping a voltage level of the first supply voltage to the plurality of digital signals,
wherein the ADC comprises:
a voltage divider, operative to generate a plurality of comparing voltages by dividing the first supply voltage into the plurality of comparing voltages; and
a plurality of comparators, each receiving a reference voltage and one of the plurality of comparing voltages and operative to generate one of the plurality of digital signals by comparing the reference voltage with the one of the plurality of comparing voltages.

8. The compensation circuit as claimed in claim 7, wherein the increment/decrement detection circuit further comprises:
a decoder, operative to generate the plurality of first/second control signals by driving the plurality of digital signals upon receiving the plurality of digital signals.

9. The compensation circuit as claimed in claim 7, wherein the duty cycle adjusting circuit comprises:
a plurality of metal-oxide-semiconductor (MOS) transistor pairs, coupled in parallel, wherein each of the plurality of MOS transistor pairs comprises a first type of MOS transistor and a second type of MOS transistor coupled in serial, and is arranged to receive one of the plurality of the control signal pairs so as to be turned on or off according to the corresponding control signal pair.

10. The compensation circuit as claimed in claim 7, wherein the first signal is generated in response to reception of data, signals, commands, addresses or clocks of a memory device, the data, signals, commands, addresses and/or clocks are received by a receiver of the memory device, and wherein the receiver is arranged to convert voltage levels of the data, signals, commands, addresses and/or clocks to an internal voltage level of the memory device.

11. The compensation circuit as claimed in claim 10, wherein the memory device is a double data rate synchronous dynamic random access memory (DDR SDRAM).

12. The compensation circuit as claimed in claim 7, wherein the duty cycle adjusting circuit increases the duty cycle of the first signal to generate the second signal when the first supply voltage is determined to have decreased.

13. A method of generating a level shifted output signal having a 50% duty cycle, comprising:
receiving an input signal and driving the input signal based on a first supply voltage to generate a first intermediate signal;
detecting changes in the first supply voltage to generate a plurality of control signal pairs, wherein contents of the plurality of control signal pairs reflect an amount of change in the first supply voltage;
adjusting a duty cycle of the first intermediate signal to compensate for the changes in the first supply voltage and generate a second intermediate signal, accordingly, wherein the second intermediate signal has a 50% duty cycle; and
receiving the second intermediate signal and driving the second intermediate signal based on a second supply voltage to generate an output signal,
wherein a voltage of the output signal is adjusted to a level of the second supply voltage and the output signal has a 50% duty cycle,
wherein the step of detecting changes in the first supply voltage to generate the plurality of control signal pairs comprises:
detecting increment in the first supply voltage to generate a plurality of first control signals as a portion of the plurality of control signal pairs; and
detecting decrement in the first supply voltage to generate a plurality of second control signals as a portion of the plurality of control signal pairs,
wherein the step of detecting changes in the first supply voltage to generate the plurality of control signal pairs further comprises:
mapping a voltage level of the first supply voltage to a plurality of digital signals, and
wherein the step of mapping the voltage level of the first supply voltage to the plurality of digital signals further comprises:
generating a plurality of comparing voltages by dividing the first supply voltage into the plurality of comparing voltages; and
comparing a reference voltage with the plurality of comparing voltages to generate the plurality of digital signals.

14. The method as claimed in claim 13, wherein the step of adjusting the duty cycle of the first intermediate signal further comprises:
turning on or off a plurality of metal-oxide-semiconductor (MOS) transistor pairs according to the plurality of control signal pairs so as to adjust the duty cycle of the first intermediate signal and accordingly generate the second intermediate signal.

15. The method as claimed in claim 13, wherein the step of detecting changes in the first supply voltage to generate the plurality of control signal pairs further comprises:
driving the plurality of digital signals to generate the plurality of first and second control signals.

16. The method as claimed in claim 13, wherein the second intermediate signal is generated by decreasing the duty cycle of the first intermediate signal when the first supply voltage is determined to have increased or by increasing the duty cycle of the first intermediate signal when the first supply voltage is determined to have decreased.

* * * * *